United States Patent
Wang et al.

(10) Patent No.: US 7,701,124 B2
(45) Date of Patent: Apr. 20, 2010

(54) WHITE LIGHT-EMITTING DEVICE HAVING A CAP LAYER FORMED FROM A MIXTURE OF SILICON AND A PHOSPHOR BLEND

(75) Inventors: Bily Wang, Hsin Chu (TW); Jonnie Chuang, Pan Chiao (TW); Chuanfa Lin, Shu Lin (TW); Chih Shan Yu, Tai Chung Hsien (TW)

(73) Assignee: Harvatek Corporation, Hsin Chu (TW)

( * ) Notice: Subject to any disclaimer, the term of this patent is extended or adjusted under 35 U.S.C. 154(b) by 419 days.

(21) Appl. No.: 11/711,840

(22) Filed: Feb. 28, 2007

(65) Prior Publication Data

US 2007/0152562 A1    Jul. 5, 2007

Related U.S. Application Data

(63) Continuation-in-part of application No. 10/830,009, filed on Apr. 23, 2004, now abandoned.

(51) Int. Cl.
  *H01J 61/02* (2006.01)
  *H01J 29/06* (2006.01)
(52) U.S. Cl. .................... 313/485; 313/512
(58) Field of Classification Search .......... 313/485–512
   See application file for complete search history.

(56) References Cited

U.S. PATENT DOCUMENTS

2002/0105266 A1* 8/2002 Juestel et al. ............... 313/512
2003/0214233 A1* 11/2003 Takahashi et al. ........... 313/512

* cited by examiner

*Primary Examiner*—Joseph L Williams
(74) *Attorney, Agent, or Firm*—Kile Goekjian Reed & McManus PLLC (57) ABSTRACT

A white light source has a substrate with a blue light-emitting diode placed thereon and a cap layer enclosing the blue light-emitting diode. The cap layer includes a mixture of silicon and phosphor blend at ratio of 1:0.2-0.5. The phosphor blend includes a red phosphor, a green phosphor and a yellow phosphor.

11 Claims, 8 Drawing Sheets

WHITE LIGHT-EMITTING DEVICE HAVING A CAP LAYER FORMED FROM A MIXTURE OF SILICON AND A PHOSPHOR BLEND

RELATED APPLICATIONS

This application is a Continuation-in-Part of currently pending application U.S. Ser. No. 10/830,009, entitled "WHITE LIGHT-EMITTING DEVICE" and filed on Apr. 23, 2004 now abandoned.

FIELD OF THE INVENTION

The present invention relates to a white light-emitting device, and especially to a white light-emitting device with both high efficiency and a good color-rendering property.

BACKGROUND OF THE INVENTION

A white light source is generally provided by mixing light sources of different wavelengths. For example, a conventional white light source can be realized by mixing red light, green light and blue light with a suitable intensity ratio. Alternatively, the white light source can be realized by mixing yellow light and blue light with a suitable intensity ratio. The conventional method for manufacturing white light source is summarized in the following.

Figure 1A:
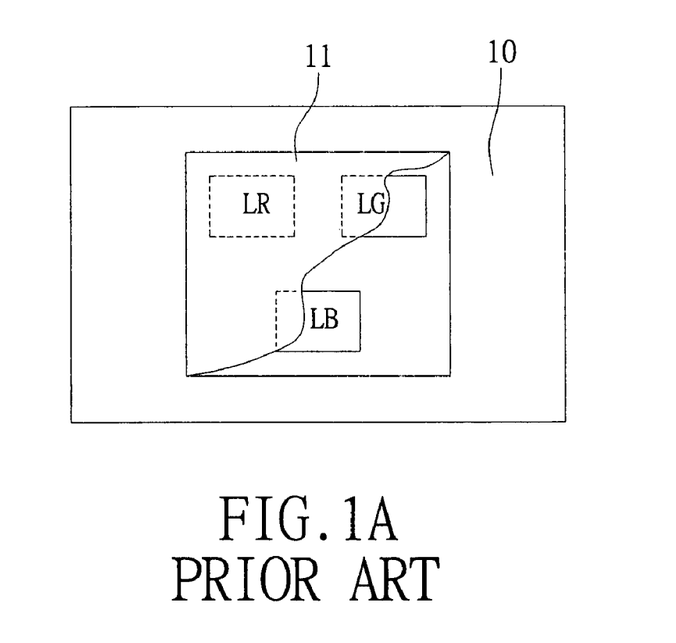
FIG. 1A shows a top view of a prior art white light-emitting device.
Figure 1B:
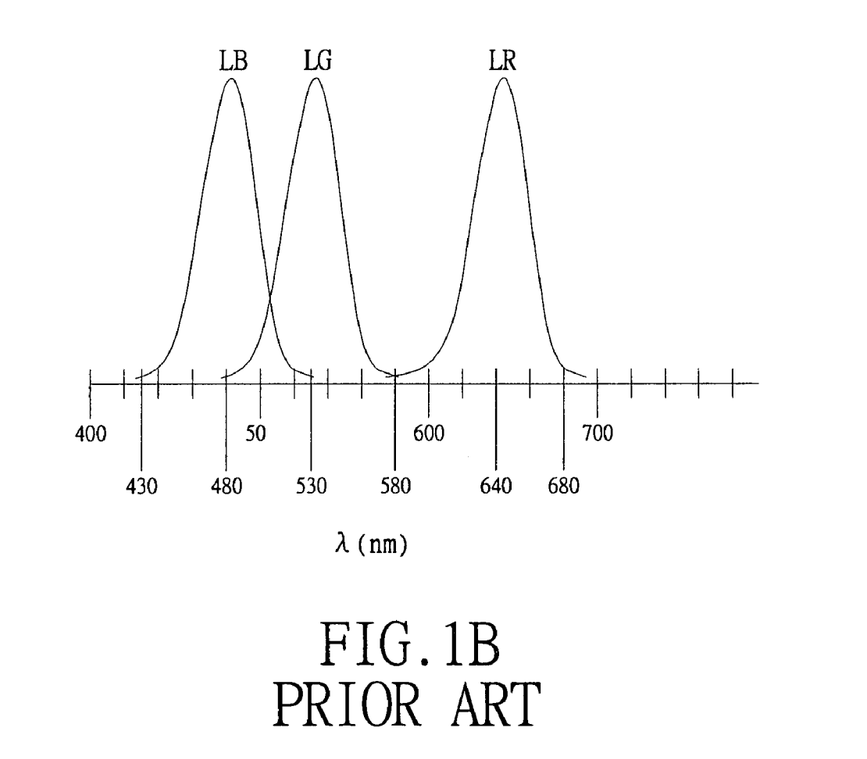
FIG. 1B shows the emission spectrum of the prior art white light-emitting device shown in FIG. 1A.

In a first prior art of white light source, three lED dies based on AlInGaP, InGaN and Gap are packaged into a lamp and emit red light, blue light and green light, respectively. The light emitted from the lamp can be mixed by a lens to provide white light. FIG. 1A shows a top view of a prior art white light-emitting device. The prior art white light-emitting device comprises a substrate 10, a red light-emitting diode lR, a green light-emitting diode lG and a blue light-emitting diode lB. FIG. 1B shows the emission spectrum of the prior art white light-emitting device shown in FIG. 1A. As shown in this figure, the spectrum of each light-emitting diodes is relatively narrow. However, the white light produced in this way lacks the uniform spectral distribution (especially in the 400 nm-700 nm range) of natural white light, such as sunlight. The white light thus produced has a relative chroma, which is, although indistinguishable to human eyes, differentiable to an instrument such as a camera. Therefore, the color-rendering property and reproducing ability are not satisfactory and this white light source is used mainly for lighting. Moreover, the driving voltages for lEDs of different colors are also different; this complicates the design of the driving circuit.

Figure 2:
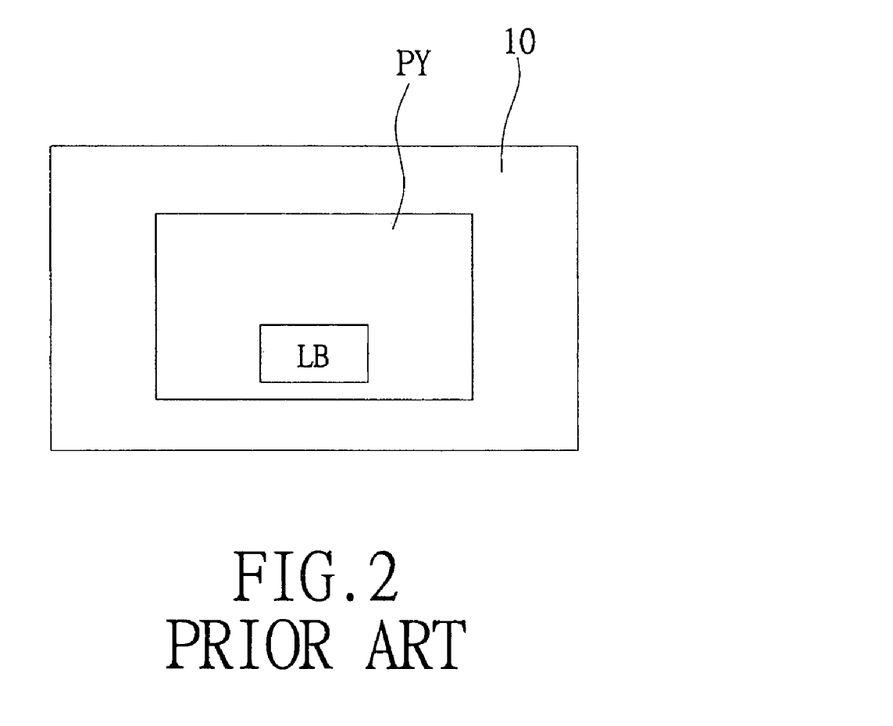
FIG. 2 shows a top view of the second prior art white light source.

A second prior art of white light source was proposed by Nichia Chemical Co. in 1996, in which an InGaN based blue lED and a yellow YAG phosphor are used to provide the white light source. This white light source requires a monochrome lED to provide white light with low cost. FIG. 2 shows a top view of the second prior art white light source proposed by Nichia Chemical Co., which comprises a substrate 10, a blue light-emitting diode lB and a yellow phosphor PY coated on the blue light-emitting diode lB. The light emitted from the blue light-emitting diode lB is converted into yellow light by the yellow phosphor PY. The yellow light is mixed with the blue light to form a white light. However, the second prior art white light source proposed by Nichia Chemical Co. has a poor color-rendering property.

SUMMARY OF THE INVENTION

It is the object of the present invention to provide a white light-emitting device with both high efficiency and a good color-rendering property.

To achieve the above object, the present invention provides a white light source including elements as follows. A blue light-emitting diode is placed on a substrate. A phosphor mixture is coated on the blue light-emitting diode and is composed of a red phosphor, a green phosphor and a yellow phosphor. The red phosphor can be CaS:Eu or SrS:Eu; the green phosphor can be $SrGa_2S_4$:Eu or $Ca_8EuMnMg(SiO_4)_4C_{12}$; and the yellow phosphor can be YAG:Ce or TbAG:Ce. The red phosphor, the green phosphor and the yellow phosphor emit, respectively, red light, green light and yellow light after receiving blue light from the blue light-emitting diode and are mixed into a white light with a good color-rendering property.

The invention further provides a light source module of the white light emitting diode, including a blue lED; a packaging substrate, wherein the blue lED is mounted on and electrically connected to the packaging substrate; a cap layer, enclosing the blue lED, wherein the cap layer includes a mixture of silicon and phosphor blend at ratio of 1:0.2-0.5, and a protective layer over the cap layer.

The above summaries are intended to illustrate exemplary embodiments of the invention, which will be best understood in conjunction with the detailed description to follow, and are not intended to limit the scope of the appended claims.

BRIEF DESCRIPTION OF DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE INVENTION

Figure 3:
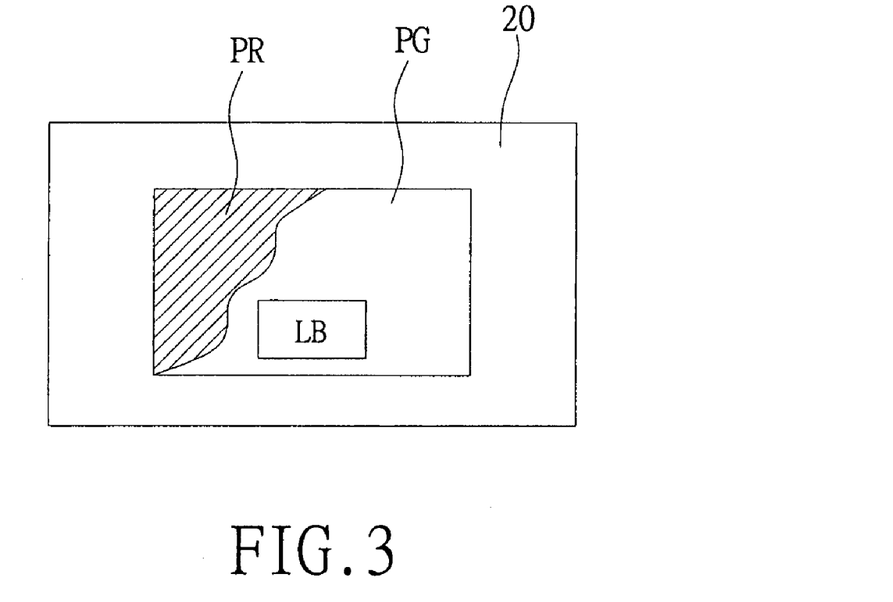
FIG. 3 shows a top view of the white light source according to the first preferred embodiment.

FIG. 3 shows a top view of the white light source 2 according to the first preferred embodiment. The white light source 2 according to the first preferred embodiment mainly comprises a substrate 20, a blue light-emitting diode lB on the substrate 20, red phosphor PR and green phosphor PG coated on the blue light-emitting diode lB. The red phosphor PR and green phosphor PG emit, respectively, red light and green light after receiving blue light from the blue light-emitting diode 1B. The red light, green light and the blue light are mixed into a white light.

The above-mentioned red phosphor PR can be CaS:Eu or SrS:Eu; the green phosphor PG can be $SrGa_2S_4$:Eu or $Ca_8EuMnMg(SiO_4)_4C_{12}$. However, the red phosphor PR and the green phosphor PG can be other material which emits red light/green light after irradiation with blue light of wavelength of 400-490 nm.

Figure 4A:
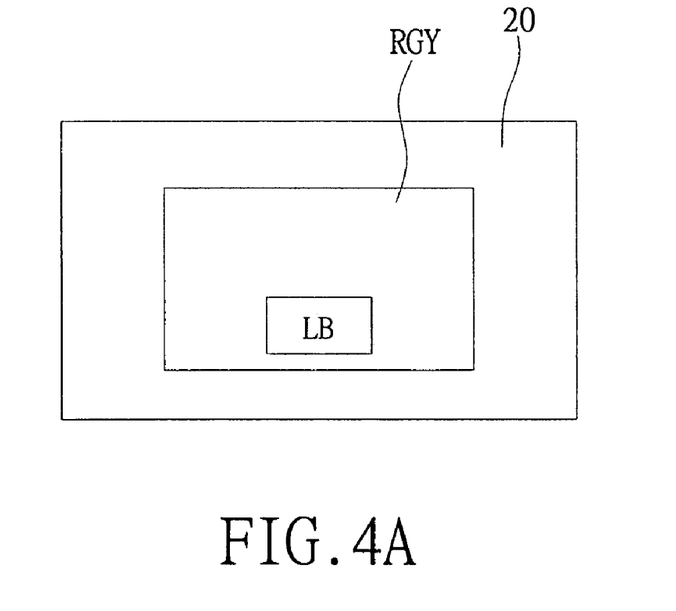
FIG. 4A shows a top view of the white light source according to the second preferred embodiment.

FIG. 4A shows a top view of the white light source 2 according to the second preferred embodiment. The white light source 2 according to the first preferred embodiment mainly comprises a substrate 20 such as an insulating substrate, a blue light-emitting diode 1B made of nitride compound and placed on the substrate 20, and a phosphor mixture RGY coated on the blue light-emitting diode 1B. The phosphor mixture RGY is the mixture of red phosphor PR, green phosphor PG and yellow phosphor PY. The white light source 2 comprises a lead portion (not shown) for connecting the anode and cathode (not shown) to a corresponding contact on the substrate 20. The electric connection for the white light source is conventional and is not described in detail here. It should be noted that the white light source 2 could be packaged in other ways than the surface mount technology shown in this figure. For example, the white light source 2 could be packaged in lamp fashion.

The red phosphor PR, the green phosphor PG and the yellow phosphor PY emit, respectively, red light, green light and yellow light after receiving blue light from the blue light-emitting diode 1B. The red light, green light, the yellow light and the blue light are mixed into a white light with good color-rendering property.

Figure 4B:
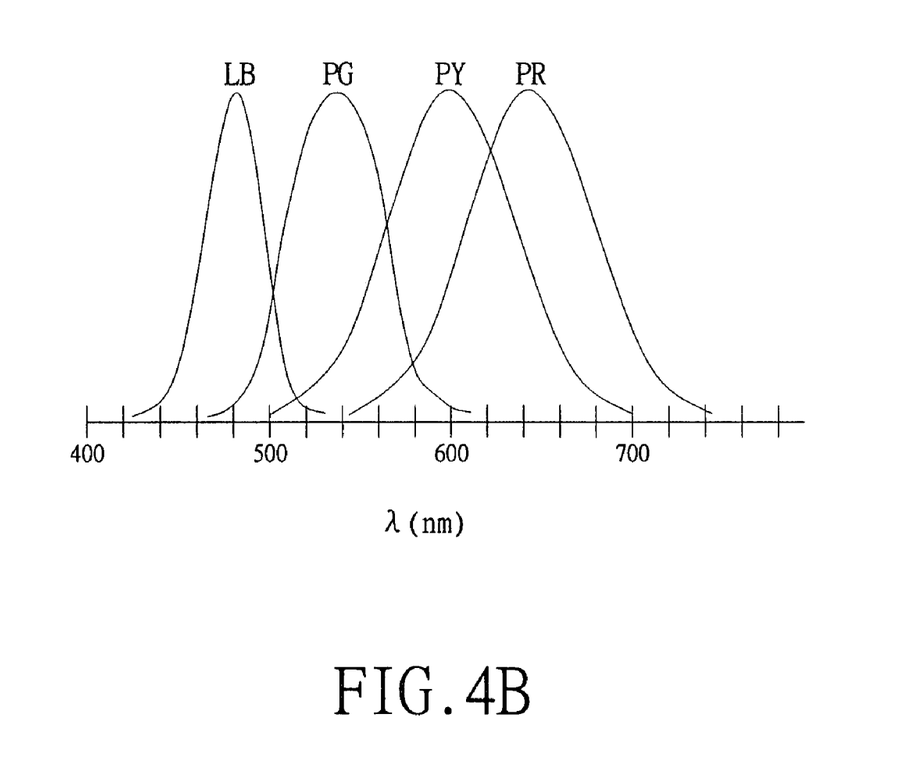
FIG. 4B shows the emission spectrum of the white light source according to the second preferred embodiment of the present invention.

FIG. 4B shows the emission spectrum of the white light source 2 according to the second preferred embodiment of the present invention. The emission peak of the blue light-emitting diode 1B, the green phosphor PG, the yellow phosphor PY and the red phosphor PR are plot from left to right. when compared with the spectrum shown in FIG. 1B, the white light source 2 according to the second preferred embodiment of the present invention has a broad spectrum contributed by the phosphors in visible light regime. Therefore, the white light source 2 according to the second preferred embodiment of the present invention has a good color-rendering property.

The added green phosphor PG and red phosphor PR can advantageously enhance the color-rendering property of the white light source 2 in comparison with the second prior art, in which only the yellow phosphor is employed. Moreover, in the present invention, the red phosphor PR, the green phosphor PG and the yellow phosphor PY can be mixed in predetermined ratio to generate a white light with different color temperature.

The above-mentioned red phosphor PR can be CaS:Eu or SrS:Eu; the green phosphor PG can be $SrGa_2S_4$:Eu or $Ca_8EuMnMg(SiO_4)_4C_{12}$; and the yellow phosphor can be YAG:Ce or TbAG:Ce. However, the red phosphor PR, the green phosphor PG and the yellow phosphor PY can be other materials, which emit red light/green/yellow light after irradiation with blue light of wavelength of 300-500 nm.

Figure 5:
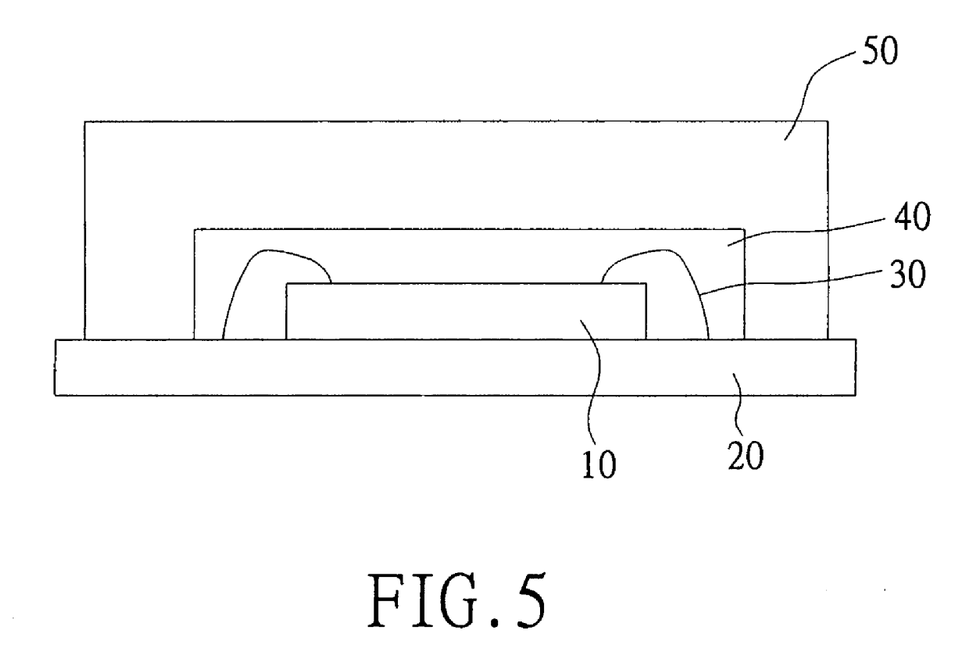
FIG. 5 shows a schematic view of a light source module of a white light emitting diode according to one embodiment of the invention.

FIG. 5 shows a schematic view of a light source module of a white light emitting diode according to one embodiment of the invention. The light source module as shown includes a blue lED 10, a packaging substrate 20 on which the blue lED 10 is electrically mounted on, wires 30 bonded the blue lED 10 to the packaging substrate 20, a cap layer 40 enclosing the wires 30 and the blue lED 10, and a protective layer 50 over the cap layer 40.

The blue lED 10 emits light of wavelength in range of 300-550 nm. The material of packaging substrate 20 and wire bonding for wires 30 are well known in the art, and therefore they can be omitted herebelow. The cap layer 40 includes a mixture of silicon and phosphor blend at ratio of 1:0.2-0.5. The phosphor blend is made on at least one selected from the group consisting of a red phosphor PR, a green phosphor PG and a yellow phosphor PY, depending on the field to apply. Optionally, a brightener can be added into the cap layer. The brightener can be any kind of conventional optical brightener as long as it is a dye that absorbs light in the ultraviolet and violet region of spectrum and re-emit light in the blue region. The protective layer 50 is made of insulative material such as epoxy resin or silicon that can protect the blue lED and the cap layer 40 from being damaged or deteriorated.

In the present invention, the red phosphor PR can be, but is not limited to, CaS:Eu or SrS:Eu; the yellow phosphor PY can be, but is not limited to, YAG:Ce or TbAG:Ce; and the green phosphor PG can be, but is not limited to, $SrGa_2S_4$:Eu or $Ca_8EuMnMg(SiO_4)_4C_{12}$. It should be noted the present invention can use other phosphor material excitable by blue light with a wavelength of 300-550 nm.

Moreover, in above preferred embodiment, the phosphor blend of red phosphor PR and the green phosphor PG generates a white light of more satisfactory color temperature.

The light source module of the white light emitting diode according to the invention is made in different composition as shown in the table below. They are subjected to the emission efficiency and the results thereof are respectively shown in FIG. 6-FIG. 10.

Figure 6:
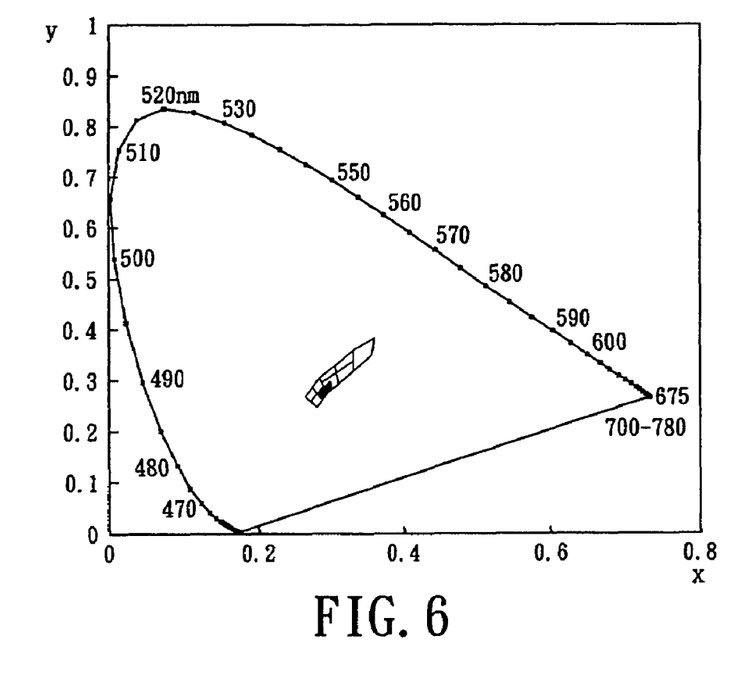
FIG. 6 shows an emission efficiency of the light source module according to the first example of the invention.
Figure 7:
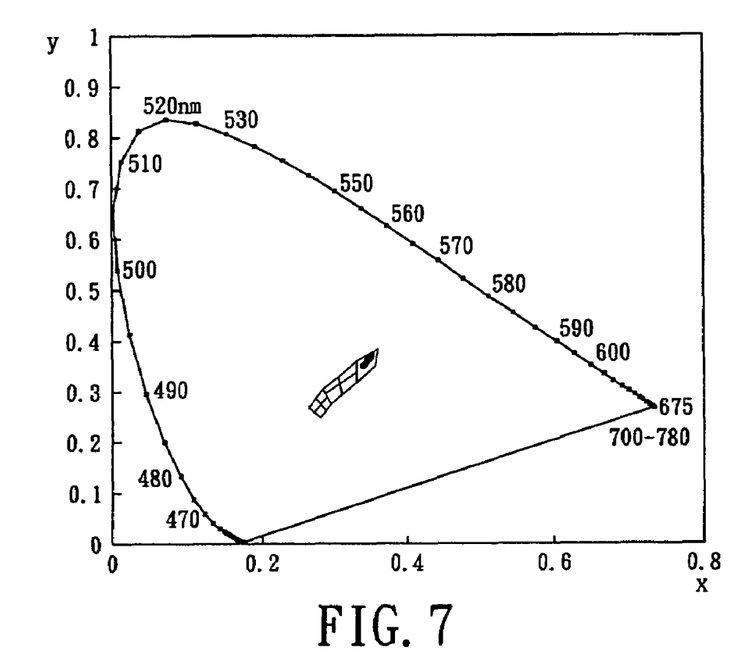
FIG. 7 shows an emission efficiency of the light source module according to the second example of the invention.
Figure 8:
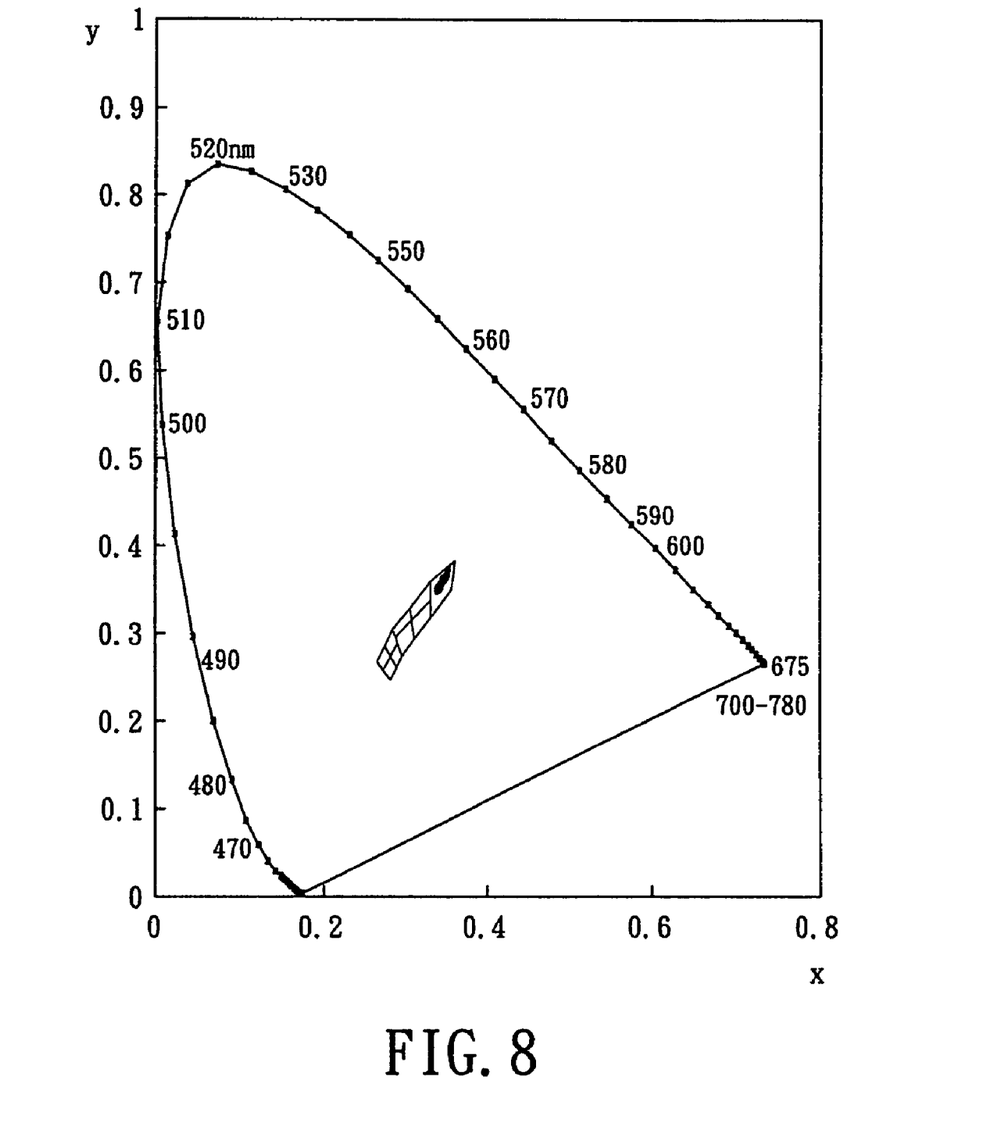
FIG. 8 shows an emission efficiency of the light source module according to the third example of the invention.
Figure 9:
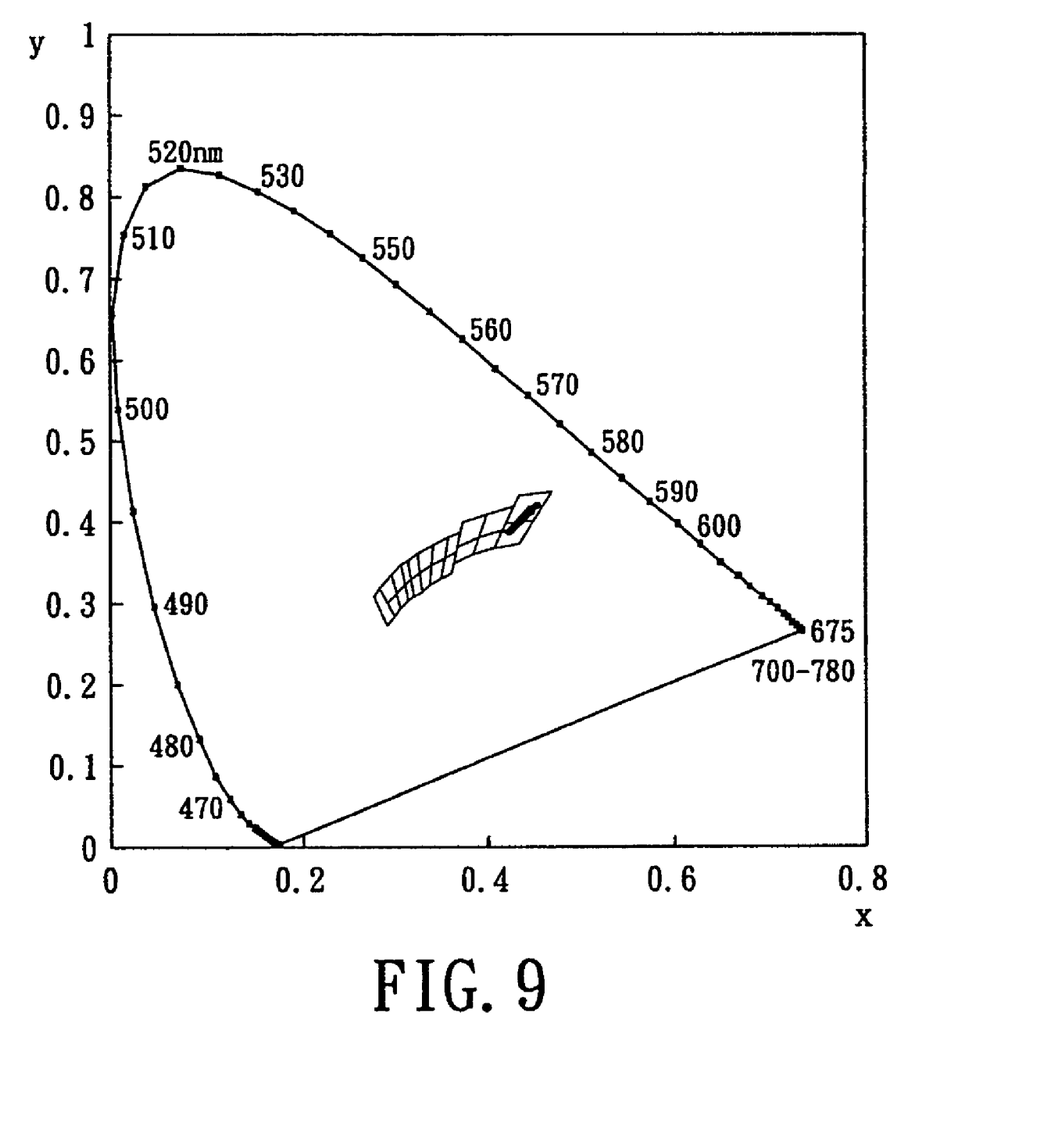
FIG. 9 shows an emission efficiency of the light source module according to the forth example of the invention.
Figure 10:
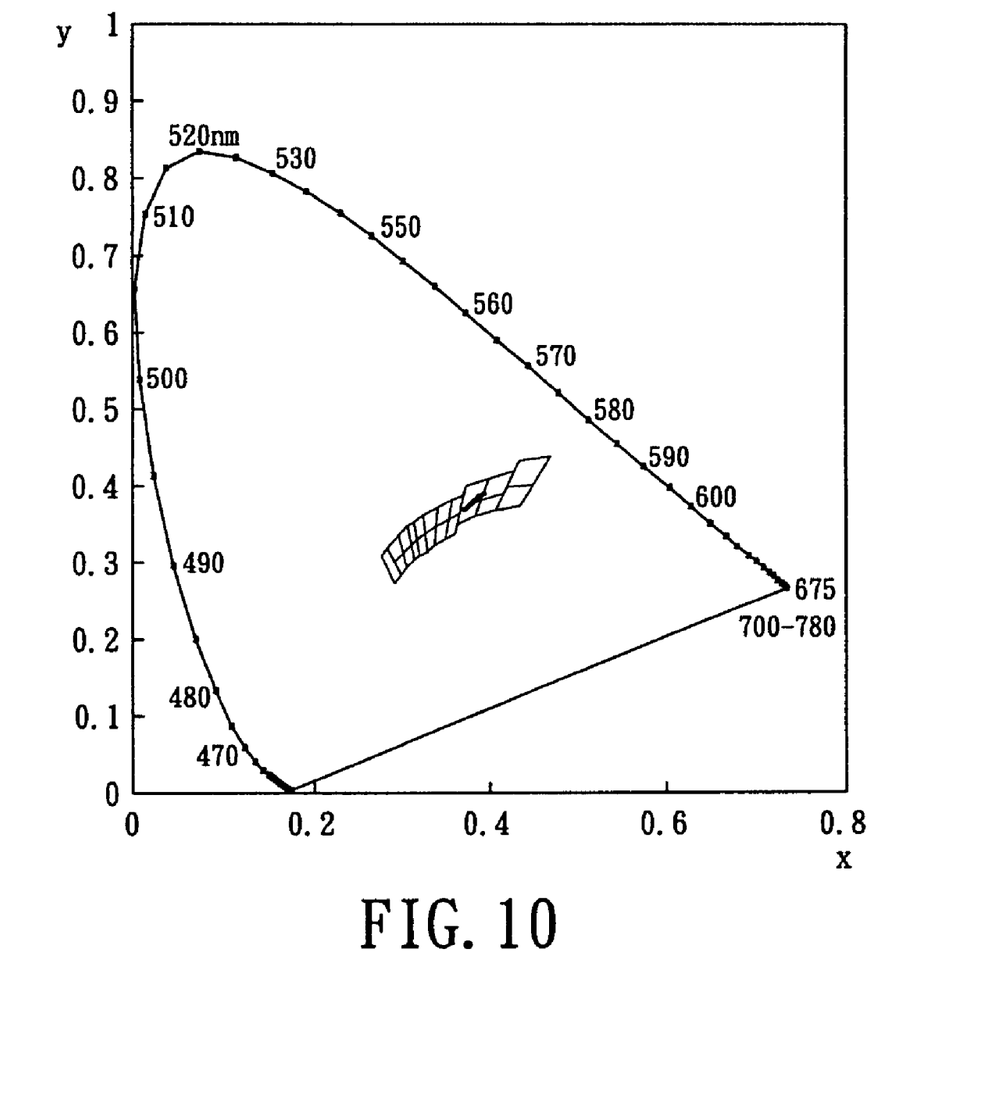
FIG. 10 shows an emission efficiency of the light source module according to the fifth example of the invention.

| Example No. | Ratio of silicon, phosphor blend and brightener | Material of protective layer | Emission efficiency | Application field | Color of light emitted |
|---|---|---|---|---|---|
| 1 | 1:0.3:0 | Epoxy | As shown in FIG. 5 | Back light of mobile phone | Pure white |
| 2 | 1:0.25:0 | Silicon | As shown in FIG. 6 | halogen light | yellowish |
| 3 | 1:0.4:0.05 | Epoxy | As shown in FIG. 7 | halogen light | yellowish |
| 4 | 1:0.3:0.3 | Silicon | As shown in FIG. 8 | wall lighting with warm color | yellowish |
| 5 | 1:0.35:0.5 | Epoxy | As shown in FIG. 9 | wall lighting with warm color | Yellowish |
| 6 | 1:0.2:0.02 | Silicon | As shown in FIG. 10 | wall lighting with warm color | Yellowish |

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A white light source, comprising:
   a substrate having a plane on a top surface thereof;
   a blue light-emitting diode placed on the substrate;
   a cap layer, enclosing the blue light-emitting diode, wherein the cap layer includes only one mixture of silicon and phosphor blend at ratio of 1:0.2-0.5, and the phosphor blend includes a red phosphor, a green phosphor and a yellow phosphor; and a protective layer covering a top surface and a peripheral surface of the cap layer, wherein the protective layer has an exposed external surface.

2. The white light source as in claim 1, wherein the red phosphor is CaS:Eu or SrS:Eu.

3. The white light source as in claim 1, wherein the green phosphor is $SrGa_2S_4$:Eu or $Ca_8EuMnMg(SiO_4)_4Cl_2$.

4. The white light source as in claim 1, wherein the yellow phosphor is YAG:Ce or TbAG:Ce.

5. The white light source as in claim 1, wherein the white light source is packaged in a surface mount device.

6. The white light source as in claim 1, wherein the substrate is an insulating substrate.

7. The white light source as in claim 1, wherein the blue light-emitting diode is made of a nitride compound.

8. The white light source as in claim 1, wherein the blue light-emitting diode emits light with a wavelength of 300-500 nm.

9. The white light source as in claim 1, wherein the red phosphor, the green phosphor and the yellow phosphor are mixed in a predetermined ratio.

10. The white light source as in claim 1, wherein the protective layer is made of epoxy resin.

11. The white light source as in claim 1, wherein the protective layer is made of silicon.

* * * * *